(12) United States Patent
Kim et al.

(10) Patent No.: US 8,422,328 B2
(45) Date of Patent: Apr. 16, 2013

(54) SEMICONDUCTOR DEVICE, SEMICONDUCTOR SYSTEM INCLUDING THE SAME, AND VOLTAGE SUPPLY METHOD OF SEMICONDUCTOR DEVICE

(75) Inventors: Ho Jung Kim, Suwon-si (KR); Chul Woo Park, Yongin-si (KR); Sang Beom Kang, Hwasung-si (KR); Jung Min Lee, Suwon-si (KR); Hyun Ho Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 646 days.

(21) Appl. No.: 12/652,209

(22) Filed: Jan. 5, 2010

(65) Prior Publication Data
US 2010/0172172 A1 Jul. 8, 2010

(30) Foreign Application Priority Data
Jan. 5, 2009 (KR) .................. 10-2009-0000365

(51) Int. Cl.
*G11C 5/14* (2006.01)

(52) U.S. Cl.
USPC .............. 365/226; 365/189.09; 365/227

(58) Field of Classification Search ............ 365/148, 365/171, 173, 189.06, 189.09, 226, 227
See application file for complete search history.

(56) References Cited

U.S. PATENT DOCUMENTS

| | | | |
|---|---|---|---|
| 2004/0004876 A1* | 1/2004 | Choi et al. | 365/202 |
| 2010/0034031 A1* | 2/2010 | Kang et al. | 365/189.09 |
| 2010/0195407 A1* | 8/2010 | Kim | 365/185.25 |

FOREIGN PATENT DOCUMENTS

| | | |
|---|---|---|
| JP | 2003-132683 A | 5/2003 |
| KR | 1999-0088380 A | 12/1999 |
| KR | 2001-0070239 A | 7/2001 |

* cited by examiner

*Primary Examiner* — Richard Elms
*Assistant Examiner* — Hien Nguyen
(74) *Attorney, Agent, or Firm* — Sughrue Mion, PLLC

(57) ABSTRACT

A semiconductor device, a semiconductor system including the same, and a voltage supply method of the semiconductor device are provided. The semiconductor device includes at least two semiconductor memory devices and a voltage supply controller configured to selectively supply a voltage to each of the at least two semiconductor memory devices.

20 Claims, 19 Drawing Sheets

SEMICONDUCTOR DEVICE, SEMICONDUCTOR SYSTEM INCLUDING THE SAME, AND VOLTAGE SUPPLY METHOD OF SEMICONDUCTOR DEVICE

CROSS-REFERENCE TO RELATED APPLICATIONS

This application claims priority from Korean Patent Application No. 10-2009-0000365 filed on Jan. 5, 2009, in the Korean Intellectual Property Office, the disclosure of which is incorporated herein by reference.

BACKGROUND

Methods and apparatuses consistent with the exemplary embodiments relate to a semiconductor device, and more particularly, to a semiconductor device for selectively supplying a voltage to at least two semiconductor memory devices included therein, a semiconductor system including the same, and a voltage supply method of the semiconductor device.

Memory is divided into volatile memory and non-volatile memory. Dynamic random access memory (DRAM) and static random access memory (SRAM) are examples of volatile memories. Flash memory, resistive memory, and phase-change memory are examples of non-volatile memories. Resistive memory uses a resistance value of a memory device to store one or more bits of data.

SUMMARY

One or more exemplary embodiments provide a semiconductor device capable of fast programming, a semiconductor system including the same, and a method of programming a resistive memory cell.

According to one or more exemplary embodiments, there is provided a semiconductor device including at least two semiconductor memory devices and a voltage supply controller configured to selectively supply a voltage to each of the at least two semiconductor memory devices.

The voltage supply controller may selectively supply the voltage to only a semiconductor memory device that is activated among the at least two semiconductor memory devices through separate power lines connected to the at least two semiconductor memory devices.

The voltage supply controller may be implemented within at least one semiconductor memory device among the at least two semiconductor memory devices. The at least two semiconductor memory devices may be vertically arranged in the semiconductor device.

Each of the at least two semiconductor memory devices may include a memory cell array including a plurality of memory cells arranged in a matrix of bit lines and word lines and a selection circuit configured to select at least one cell from among the plurality of memory cells. The voltage supply controller may selectively supply the voltage to only the at least one cell selected by the selection circuit.

The plurality of memory cells may be resistive memory cells. The selection circuit may include at least one circuit between a word line selection circuit selecting a word line and a bit line selection circuit selecting a bit line. Each of the at least two semiconductor memory devices may include a plurality of memory blocks each comprising a memory cell array comprising a plurality of memory cells arrange in a matrix of bit lines and word lines; a plurality of selection circuits each configured to select at least one memory cell comprised in one memory block among the plurality of memory blocks, and the voltage supply controller selectively supplies the voltage to only the at least one cell selected by each of the selection circuits. Each of the at least two semiconductor memory devices further comprises a main word line decoder activating a main word line shared by the plurality of memory blocks, each of the selection circuits activates at least one sub word line connected to the main word line selected by the main word line decoder, and the voltage supply controller selectively supplies the voltage to only a sub word line connected to a memory cell subjected to a write or read operation among the at least one sub word line.

Each of the at least two semiconductor memory devices may include a plurality of memory units configured to store data or read data, and the voltage supply controller selectively supplies the voltage to only a memory unit subjected to a write or read operation among the plurality of memory units. Each of the memory units may include a memory cell array including a plurality of memory cells arranged in a matrix of a plurality of sub word lines and a plurality of sub bit lines; a plurality of main word lines each connected to the plurality of sub word lines; a main word line decoder configured to generate a main word line selection signal for selecting at least one main word line among the plurality of main word lines in response to an address signal; and a sub word line selection circuit configured to select at least one sub word line from among the plurality of sub word lines in response to the main word line selection signal and a sub word line selection signal. The voltage supply controller selectively supplies the voltage to only the at least one sub word line selected by the sub word line selection circuit. The sub word line selection circuit may include a first sub word line selection block configured to select the plurality of sub word lines based on the main word line selection signal and the voltage; and a second sub word line selection block configured to enable at least one sub word line only among the plurality of sub word lines based on the sub word line selection signal and the voltage.

According to one or more exemplary embodiments, there is provided a semiconductor device including a plurality of memory blocks arranged vertically, with each memory block including a plurality of memory cell arrays, and at least one voltage supply controller configured to selectively supply a voltage to only a memory block that is activated by a selection signal among the plurality of memory blocks.

The at least one voltage supply controller may selectively supply the voltage to each of the memory blocks through a separate power line.

The at least one voltage supply controller may selectively supply the voltage to only a memory cell array activated by the selection signal among the plurality of memory cell arrays.

According to one or more exemplary embodiments, there is provided a method of supplying a voltage in a semiconductor device. The method includes outputting a selection signal for activating at least one memory cell comprised in one device among at least two semiconductor memory devices and selectively supplying a voltage to a semiconductor memory device including the at least one memory cell that is activated among the at least two semiconductor memory devices.

The selectively supplying the voltage may include selectively supplying the voltage to at least one word line connected with the at least one memory cell that is activated by the selection signal.

The at least two semiconductor memory devices may be vertically arranged in the semiconductor device.

The selection signal may activate at least one circuit between a word line selection circuit and a bit line selection circuit which are included in the one semiconductor memory device among the at least two semiconductor memory devices.

According to one or more exemplary embodiments, there is provided a semiconductor system including a semiconductor device and a processor configured to control a program operation and a verify read operation of the semiconductor device. The semiconductor device includes at least two semiconductor memory devices and a voltage supply controller configured to selectively supply a voltage to each of the at least two semiconductor memory devices.

The semiconductor system may further include a battery configured to supply operation power to the semiconductor device and the processor.

The semiconductor system may further include a wireless interface configured to be connected to the processor.

The semiconductor system may further include a input/output (I/O) interface configured to be connected to the processor.

The semiconductor system may further include an image sensor configured to be connected to the processor.

BRIEF DESCRIPTION OF THE DRAWINGS

The above and other aspects will become more apparent by describing in detail exemplary embodiments with reference to the attached drawings in which.

DETAILED DESCRIPTION OF THE EXEMPLARY EMBODIMENTS

Figure 1:
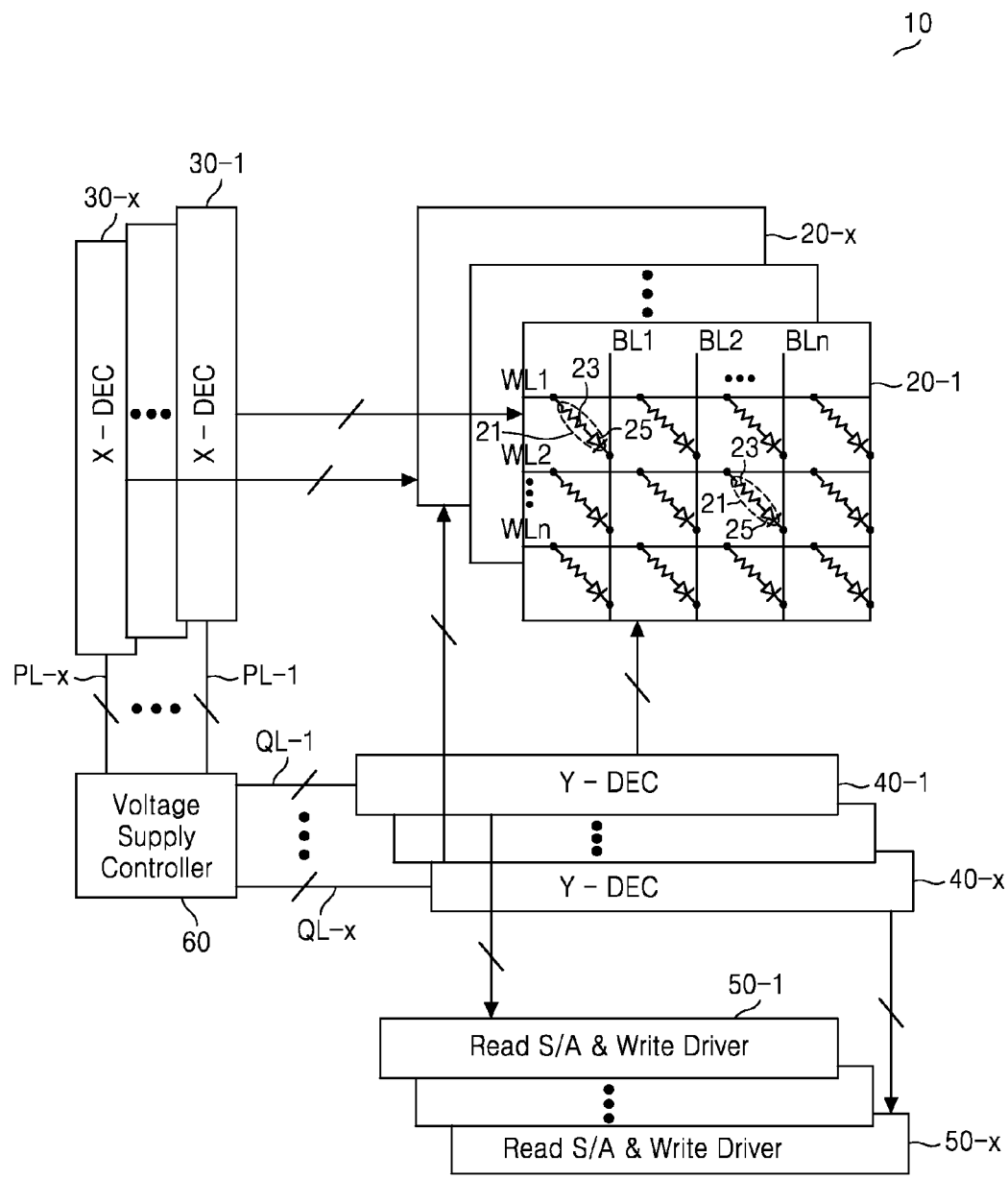
FIG. 1 is a conceptual block diagram of a semiconductor device according to an exemplary embodiment.

Exemplary embodiments now will be described more fully hereinafter with reference to the accompanying drawings. The exemplary embodiments are provided for illustrative purposes and should not be construed as limiting. The exemplary embodiments are provided so that this disclosure will be thorough and complete, and will fully convey a complete understanding to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
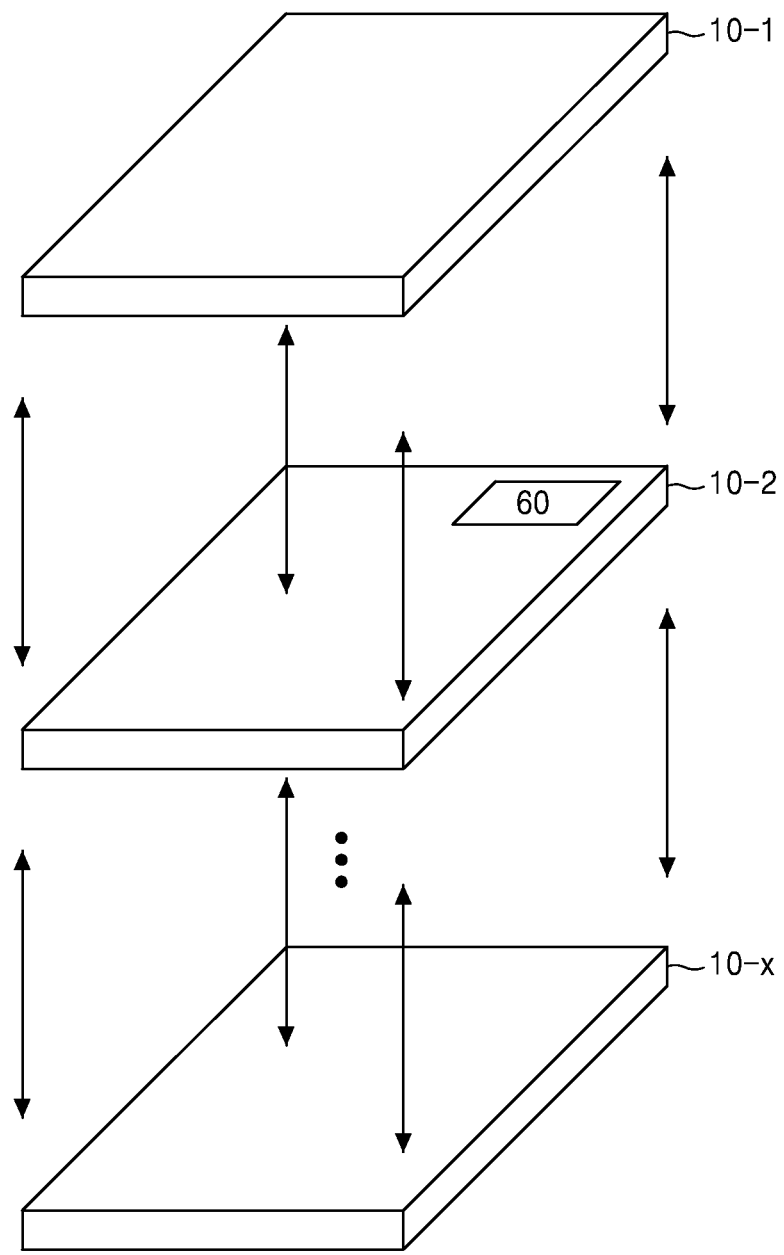
FIG. 2 is a conceptual perspective view of the semiconductor device illustrated in FIG. 1.
Figure 3:
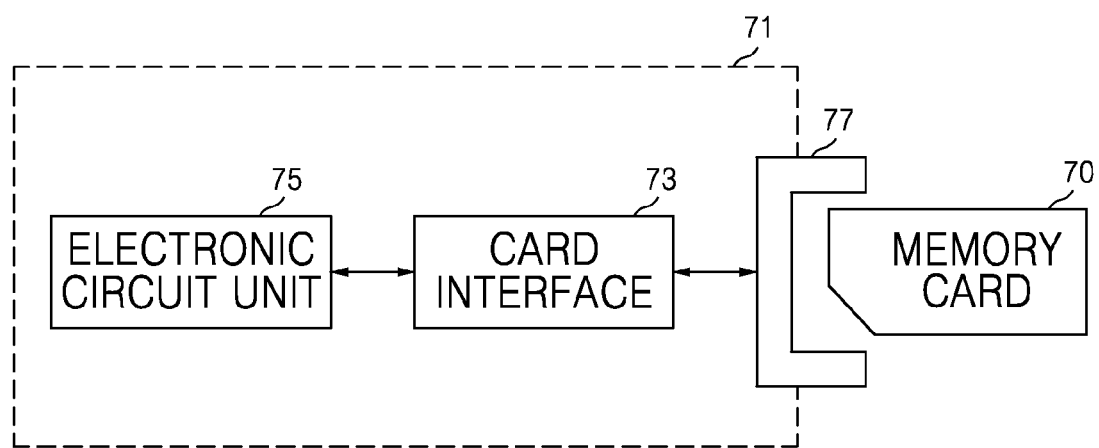
FIG. 3 illustrates an electronic system including the semiconductor device illustrated in FIG. 1.

FIG. 1 is a conceptual block diagram of a semiconductor device 10 according to an exemplary embodiment. FIG. 2 is a conceptual perspective view of the semiconductor device 10 illustrated in FIG. 1. FIG. 3 illustrates an electronic system including the semiconductor device 10 illustrated in FIG. 1. FIGS. 4A through 4J are diagrams showing exemplary embodiments of an electronic machine including the electronic system illustrated in FIG. 3. Referring to FIGS. 1 through 4J, the semiconductor device 10 includes a plurality of semiconductor memory devices or memory chips 10-1 through 10-X (where X is a natural number) and a voltage supply controller 60.

The semiconductor device 10 may be a multi-chip package (MCP) implemented using three-dimensional (3D) stacking, as illustrated in FIG. 2. The voltage supply controller 60 may be implemented in one device (e.g., 10-2) among the semiconductor memory devices 10-1 through 10-X.

The semiconductor device 10 may be implemented in a memory card 70. The memory card 70 may be a compact flash card, a memory stick, a memory stick duo, a multimedia card (MMC), a reduced-size MMC, a secure digital (SD) card, a mini SD card, a micro SD card (or a transflash card), a smart card, or an xD-picture card.

The semiconductor device 10 is electrically connected to a memory slot 77 (FIG. 3) and stores data (e.g., video data or audio data) output from an electronic circuit unit 75 through a card interface 73 included in a host 71 or transmits stored data to the electronic circuit unit 75.

Figure 4A:
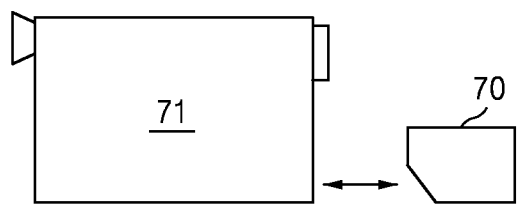
FIGS. 4A through 4J are diagrams showing exemplary embodiments of an electronic machine including the electronic system illustrated in FIG. 3.
Figure 4B:
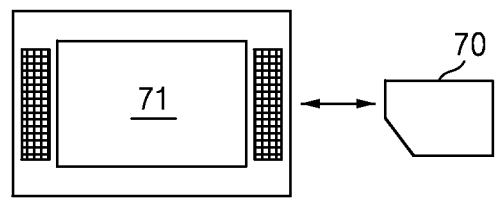
Figure 4C:
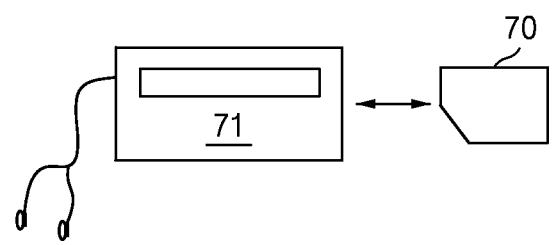
Figure 4D:
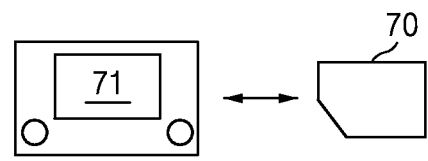
Figure 4E:
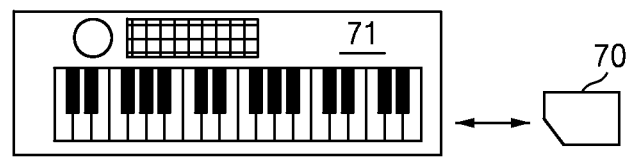
Figure 4F:
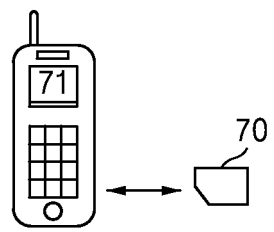
Figure 4G:
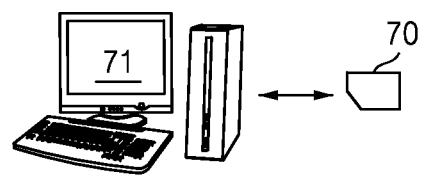
Figure 4H:
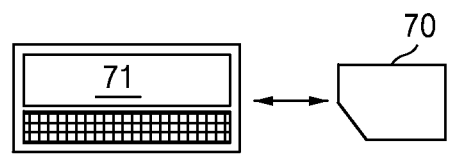
Figure 4I:
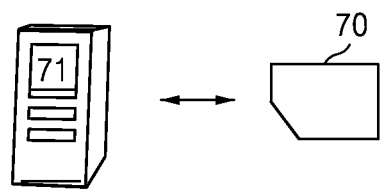
Figure 4J:
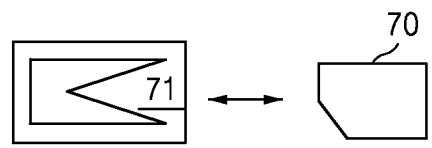

When the host 71 is a video camera as shown in FIG. 4A, for example, the electronic circuit unit 75 may include a CMOS image sensor (CIS), an image processor, a digital signal processor and transmit data (e.g., video or audio data) generated in the electronic circuit unit 75 to the memory card 70 through the card interface 73. The memory card 70 including the semiconductor device 10 may be implemented to be installed in a television (FIG. 4B), an MP3 player (FIG. 4C), a game console (FIG. 4D), an electronic instrument (FIG. 4E), a portable terminal (FIG. 4F), a personal computer (PC) (FIG. 4G), a personal digital assistant (PDA) (FIG. 4H), a voice recorder (FIG. 4I), or a PC card (FIG. 4J).

The semiconductor memory devices 10-1 through 10-X may be arranged vertically in the semiconductor device 10, as illustrated in FIG. 2. For example, the semiconductor memory devices 10-1 through 10-X may each include a silicon substrate and a circuit layer and may be connected with each another via a through-silicon via (TSV) within a vertical interconnection ball. The semiconductor memory devices 10-1 through 10-X may be implemented using phase-change random access memory (PRAM), read-only memory (ROM), electrically erasable programmable ROM (EEPROM), or flash memory.

The semiconductor memory devices 10-1 through 10-X include memory cell arrays 20-1 through 20-X, respectively, row decoders 30-1 through 30-X, respectively, column decoders 40-1 through 40-X, respectively, and a sense amplifier (S/A) and write drivers 50-1 through 50-X, respectively. For instance, the semiconductor memory device 10-1 includes the memory cell array 20-1, the row decoder 30-1, the column decoder 40-1, and the S/A and write driver 50-1. The memory cell array 20-1 includes a plurality of bit lines BL1 through BLn, a plurality of word lines WL1 through WLn, and a plurality of memory cells 21.

The memory cells 21 may be resistive memory cells. Each of the memory cells 21 may be selected by an output signal of the row decoder 30-1 decoding a row address and an output signal of the column decoder 40-1 decoding a column address.

Each resistive memory cell 21 may use a resistance value of a resistive memory device to store one or more bits of data. For instance, a resistive memory device programmed to have a high resistance value may represent a logic "1" data bit value and a resistive memory device programmed to have a low resistance value may represent a logic "0" data bit value.

Each resistive memory cell 21 includes a resistive memory device 23 and an access device 25 controlling current flowing in the resistive memory device 23. The resistive memory device 23 is referred to as a memory cell or a memory material according to an exemplary embodiment.

Each resistive memory cell 21 may be implemented by PRAM. Accordingly, the PRAM referred to as PCRAM or ovonic unified memory (OUM) may be made using a phase-change material, e.g., chalcogenide alloy, to form the resistive memory device 23. At this time, the resistive memory device 23 is referred to as a chalcogenide device. Alternatively, the resistive memory device 23 may be implemented using a phase-change material having a different resistance value according to a crystalline state or an amorphous state.

For instance, the phase-change material may be a compound of two elements such as GaSb, InSb, InSe, $Sb_2Te_3$, or GeTe; a compound of three elements such as GeSbTe, GaSeTe, InSeTe, $SnSb_2Te_4$, or InSbGe; or a compound of four elements such as AgInSbTe, (GnSn)SbTe, GeSb(SeTe), or $Te_{81}Ge_{15}Sb_2S_2$.

The access device 25 referred to as an isolation device may be implemented as a diode type, a metal-oxide semiconductor field effect transistor (MOSFET) type, or a bipolar junction transistor (BJT) type. For clarity of the description, the access device 25 is illustrated as the diode type, but other types may also be used.

The structures and the operations of the row decoders 30-2 through 30-X may be substantially the same as those of the row decoder 30-1. The row decoder 30-1 may select at least one of the word lines WL1 through WLn in the memory cell array 20-1 based on a word lines selection signal and a voltage output from the voltage supply controller 60. At this time, the voltage supply controller 60 may selectively output the voltage, which will be described in detail later.

The structures and the operations of the column decoders 40-2 through 40-X may be substantially the same as those of the column decoder 40-1. The column decoder 40-1 may select at least one of the bit lines BL1 through BLn in the memory cell array 20-1 based on a voltage selectively supplied by the voltage supply controller 60.

The structures and the operations of the S/A and write drivers 50-2 through 50-X may be substantially the same as those of the S/A and write driver 50-1. The S/A and write driver 50-1 may write data to each resistive memory cell 21 in the memory cell array 20-1 or verify-read or read data from each resistive memory cell 21.

The voltage supply controller 60 may selectively supply a voltage to each of the semiconductor memory devices 10-1 through 10-X. For example, the voltage supply controller 60 is connected with the semiconductor memory devices 10-1 through 10-X through separate power lines PL-1 through PL-X, respectively, and separate power lines QL-1 through QL-X, and therefore, when the memory cell array (e.g., 20-1) of one semiconductor memory device (e.g., 10-1) is activated, a voltage may be supplied to only the row decoder 30-1. At this time, voltage supply controller 60 receives information about the memory cell (e.g., 20-1) of the activated semiconductor memory device (e.g., 10-1) from a controller (not shown) and supplies a voltage to only the row decoder 30-1 of the semiconductor memory device 10-1 based on the received information.

In detail, the voltage supply controller 60 may selectively supply voltage to at least one resistive memory cell 21 activated by the row decoder 30-1. For instance, when the row decoder 30-1 outputs a word line selection signal for selecting at least one word line, i.e., the word lines WL1 through WLn of the first semiconductor memory device 10-1, the voltage supply controller 60 may selectively apply a voltage to only the first semiconductor memory device 10-1 among the plurality of the semiconductor memory devices 10-1 through 10-X.

In other words, the voltage supply controller 60 of the semiconductor device 10 selectively supplies a voltage to the semiconductor memory devices 10-1 through 10-X forming different layers, thereby reducing decoding complexity of at least one of the memory cell arrays 20-1 through 20-X.

In addition, the voltage supply controller 60 of the semiconductor device 10 selectively supplies a voltage to only an activated semiconductor memory device (e.g., 10-1), thereby reducing leakage current that may occur in inactive semiconductor memory devices 10-2 through 10-X.

Figure 5:
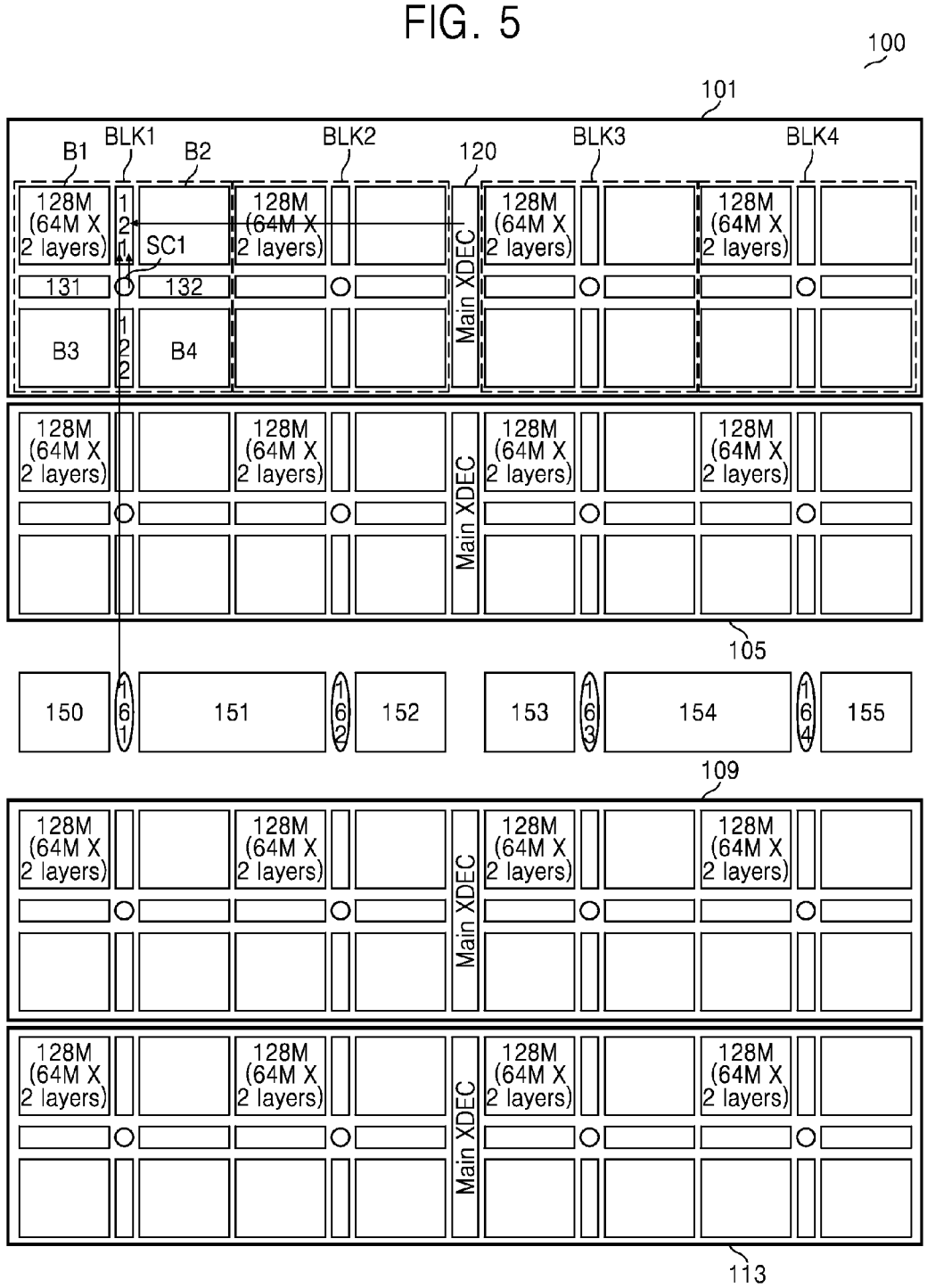
FIG. 5 is a conceptual block diagram of a semiconductor device according to an exemplary embodiment.
Figure 6:
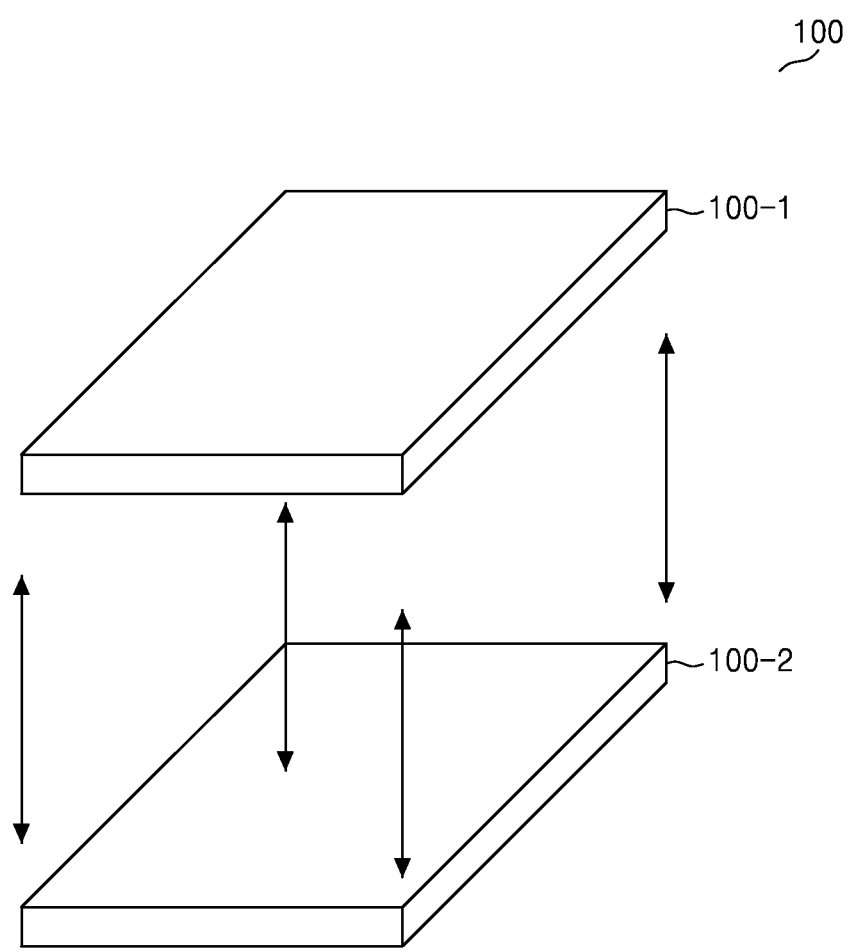
FIG. 6 is a conceptual perspective view of the semiconductor device illustrated in FIG. 5.
Figure 7:
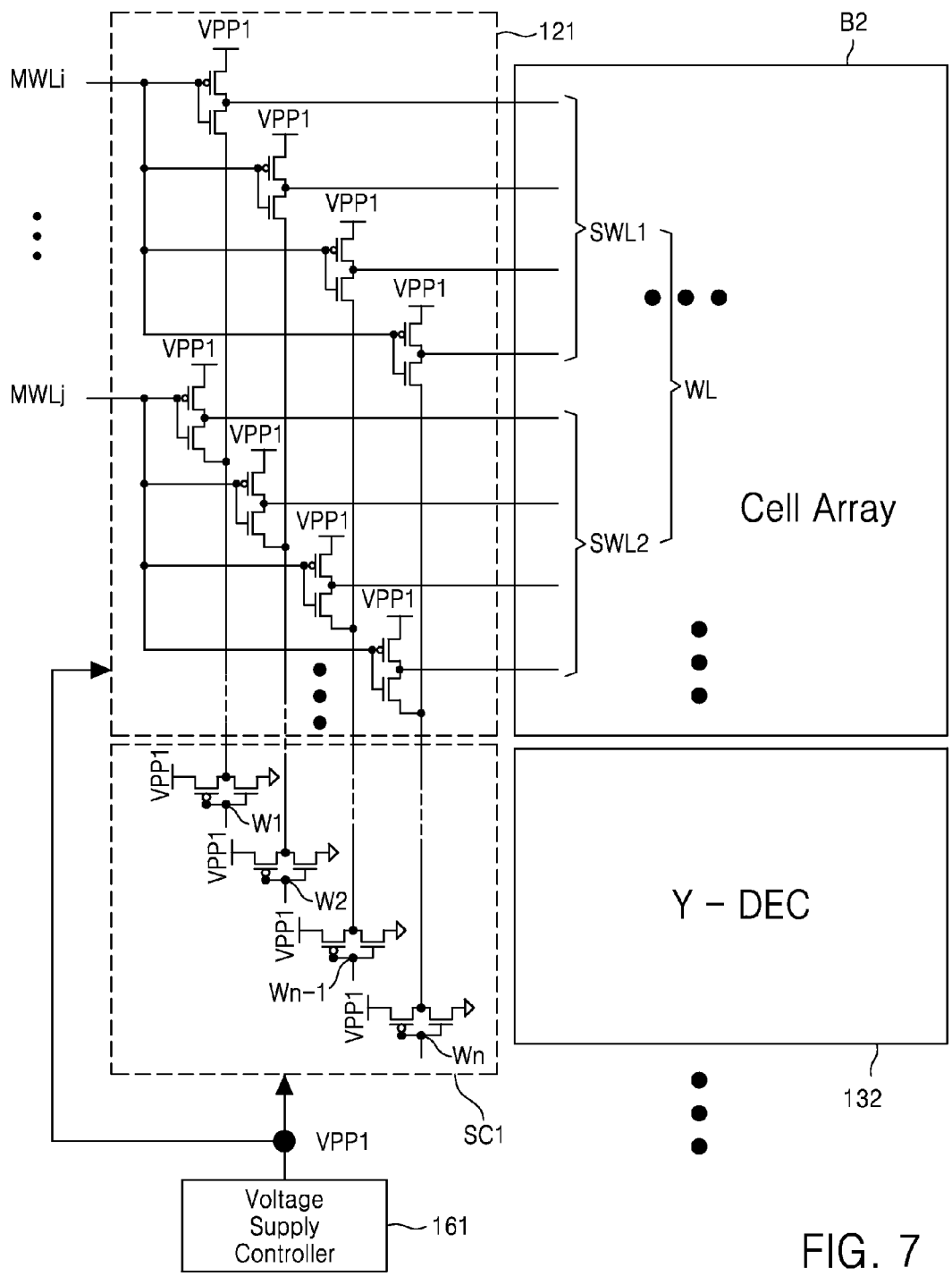
FIG. 7 is a circuit diagram for explaining a voltage supply method of the semiconductor device illustrated in FIG. 5.
Figure 8:
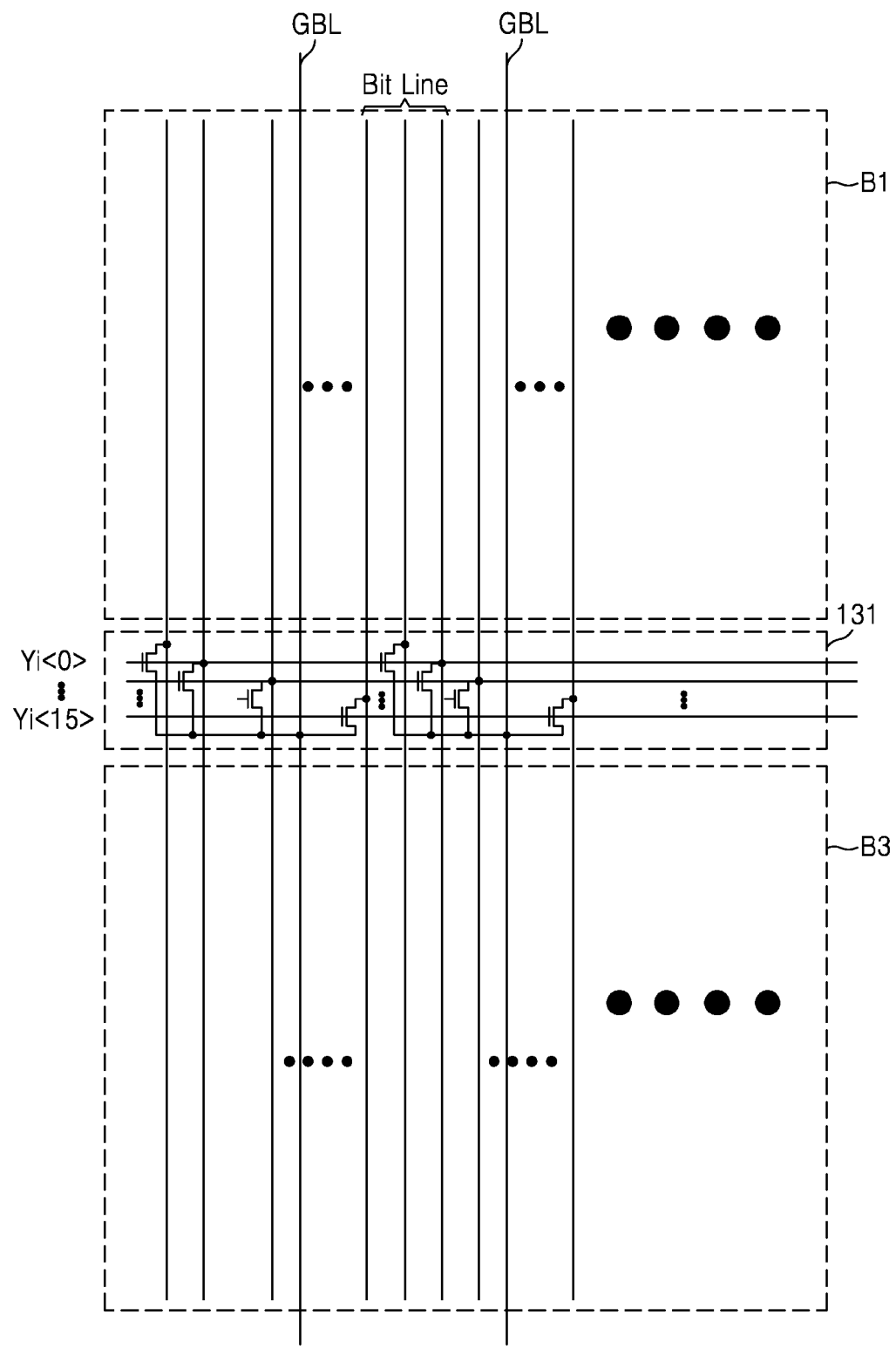
FIG. 8 is a circuit diagram of a bit line decoder and a memory cell array illustrated in FIG. 5.

FIG. 5 is a conceptual block diagram of a semiconductor device 100 according to an exemplary embodiment. FIG. 6 is a conceptual perspective view of the semiconductor device 100 illustrated in FIG. 5. FIG. 7 is a circuit diagram for explaining a voltage supply method of the semiconductor device 100 illustrated in FIG. 5. FIG. 8 is a circuit diagram of a bit line decoder and a memory cell array illustrated in FIG. 5.

Referring to FIGS. 5 through 8, the semiconductor device 100 includes a plurality of semiconductor memory devices 100-1 and 100-2 formed at a plurality of (e.g., two) layers, respectively. In other words, the semiconductor device 100 may be an MCP implemented using 3D stacking.

Each of the semiconductor memory devices 100-1 and 100-2 may be selectively supplied with a voltage by one or more voltage supply controllers 161 through 164 included in each semiconductor memory device 100-1 or 100-2. Alternatively, the semiconductor memory devices 100-1 and 100-2 may be selectively supplied with a voltage by a single voltage supply controller (e.g., 60) as illustrated in FIG. 1.

Hereinafter, the functions and the structure of the semiconductor memory devices 100-1 and 100-2 formed at different layers, respectively, in the semiconductor device 100 will be explained by describing the functions and the structure of the semiconductor memory device 100-1 formed at a first layer.

The semiconductor memory device 100-1 includes a plurality of memory blocks 101, 105, 109, and 113, one or more voltage supply controllers 161 through 164, and a plurality of S/A and write drivers 150 through 155.

The structures and the operations of the memory blocks 105, 109, and 113 may be substantially the same as those of the memory block 101. The memory block 101 includes a plurality of memory units BLK1 through BLK4 and a main row decoder (or a main word line decoder) 120.

The structures and the operations of the memory units BLK2 through BLK4 may be substantially the same as those of the memory unit BLK1. The memory unit BLK1 may read data from and write data to a memory cell based on a main word line selection signal, a bit line selection signal, and a supply voltage VPP1. The memory unit BLK1 includes one or more first sub word line selection blocks 121 and 122, a second sub word line selection block SC1, one or more column decoders 131 and 132, and one or more memory cell arrays B1 through B4.

The structure and the operations of the first sub word line selection block 122 may be substantially the same as those of the first sub word line selection block 121. The first sub word line selection block 121 may select at least one sub word line WL corresponding to a main word line based on a main word line selection signal MWLi or MWLj output from a main row decoder 120 and the supply voltage VPP1 selectively supplied by the voltage supply controller 161.

For instance, as illustrated in FIG. 7, the first sub word line selection block 121 may select a first sub word line group SWL1 in response to the first main word line selection signal MWLi and a second sub word line group SWL2 in response to the second main word line selection signal MWLj. At this time, the voltage supply controller 161 selectively supplies the supply voltage VPP1 to the first sub word line selection block 121 so that the supply voltage VPP1 is supplied to only a sub word line connected to a resistive memory cell actually subjected to the read or write operation among a plurality of sub word lines WL.

The second sub word line selection block SC1 may enable at least one sub word line among at least one sub word line selected by the first sub word line selection block 121 based on sub word line selection signals W1 through Wn and the supply voltage VPP1 selectively supplied by the voltage supply controller 161. At this time, the voltage supply controller 161 selectively supplies the supply voltage VPP1 to the second sub word line selection block SC1 so that the supply voltage VPP1 is supplied to only a sub word line connected to a resistive memory cell actually subjected to the read or write operation among a plurality of sub word lines WL.

The structure and the operations of the column decoder 132 may be substantially the same as those of the column decoder 131. The column decoder 131 may select at least one bit line in the memory cell arrays B1 and B3. For instance, as illustrated in FIG. 8, the column decoder 131 may select at least one bit line (BL1, . . . , BLn) in response to at least one of column address signals Yi<0> through Yi<15> and output a current output from the selected bit line through a global bit line GBL.

The structure and the operations of the memory cell arrays B2 through B4 may be substantially the same as those of the memory cell array B1. The memory cell array B1 may include a plurality of bit lines, a plurality of word lines, and a plurality of resistive memory cells. At this time, the structure and the operations of each resistive memory cell may be substantially the same as those of the resistive memory cell 21 described in detail with reference to FIG. 1. Thus, a detailed description thereof will be omitted.

The main row decoder (or the main word line decoder) 120 may output the main word line selection signals MWLi or MWLj for selecting a main word line in response to a row address transmitted from the controller (not shown).

The structure and the operations of the voltage supply controllers 162 through 164 may be substantially the same as those of the voltage supply controller 161. The voltage supply controller 161 may selectively supply a voltage to the memory blocks 101, 105, 109, and 113. At this time, the voltage supply controller 161 may selectively supply a voltage to the memory blocks 101, 105, 109, and 113 through separate power lines independently connected to the memory blocks 101, 105, 109, and 113. For instance, the voltage supply controller 161 may receive information about a semiconductor memory block (e.g., 101) which is activated, from the controller (not shown) and supply a voltage to only a row decoder (e.g., 121) of the semiconductor memory block 101 based on the received information.

In other words, when a memory cell array (e.g., B1) of one semiconductor memory block (e.g., 101) among the plurality of the memory blocks 101, 105, 109, and 113 is activated, the voltage supply controller 161 supplies a voltage to only the row decoder, i.e., the first sub word line selection block 121 selecting a resistive memory cell in the memory cell array B1, thereby selectively supplying the voltage to only at least one resistive memory cell activated by the row decoder, i.e., the first sub word line selection block 121. For instance, when the row decoder, i.e., the first sub word line selection block 121 outputs a word line selection signal for selecting at least one word line from the memory cell array B2, the voltage supply controller 161 may selectively apply a voltage to only one memory cell array B2 among the plurality of the memory cell arrays B1 through B4.

In other words, the voltage supply controller 161 of the semiconductor device 100 according to an exemplary embodiment selectively supplies a voltage to each layer and also selectively supplies the voltage to each memory cell array for pre-decoding, thereby reducing the decoding complexity of the semiconductor device 100. In addition, the voltage supply controller 161 selectively supplies the voltage to only the memory cell array that is activated, thereby reducing leakage current that may occur in a memory cell array that is not activated.

The structure and the operations of the S/A and write drivers 151 through 155 may be substantially the same as those of the S/A and write driver 150. The S/A and write driver 150 may write data to a plurality of resistive memory cells in at least one memory cell array, i.e., the memory cell arrays B1 and B3 and may verify-read or read data from the resistive memory cells.

Figure 9:
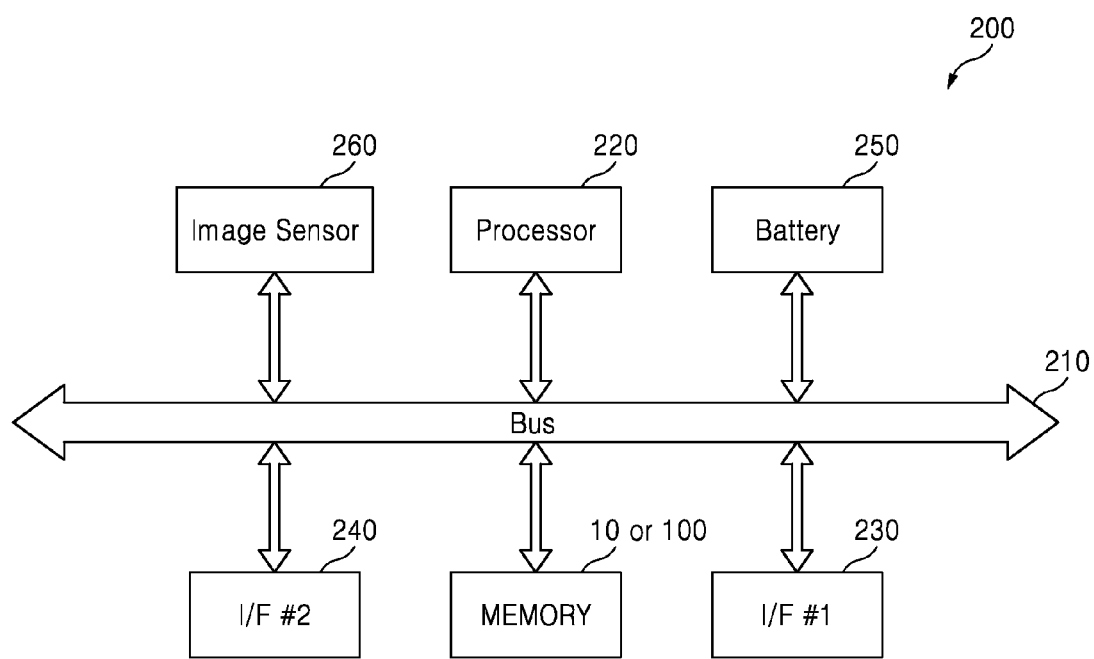
FIG. 9 is a schematic block diagram of a semiconductor system including a semiconductor device according to an exemplary embodiment.

FIG. 9 is a schematic block diagram of a semiconductor system 200 including the semiconductor device 10 or 100 according to an exemplary embodiment. Referring to FIGS. 1, 5, and 9, the semiconductor system 200 may include the semiconductor device 10 or 100 and a processor 220, which are connected to a system bus 210.

The processor 220 may generally control the write operation, the read operation, or the verify read operation of the semiconductor device 10 or 100. For example, the processor 220 outputs write data and a command to control the write operation of the semiconductor device 10 or 100. Also, the processor 220 may generate a command to control the read operation or the verify read operation of the semiconductor device 10 or 100. Thus, the semiconductor device 10 or 100 may perform the verify read operation or the program operation or the write operation in response to the control signal output from the processor 220.

When the semiconductor system 200 is implemented as a portable application, the semiconductor system 200 may further include a battery 250 for supplying operation power to the semiconductor device 10 or 100 and the processor 220. The portable application may include portable computers, digital cameras, personal digital assistants (PDAs), cellular telephones, MP3 players, portable multimedia players, automotive navigation systems, memory cards, smart cards, game consoles, electronic dictionaries, or solid state discs.

The semiconductor system 200 may further include an interface, for example, an I/O device 230, for exchange data with an external data processing device. When the semiconductor system 200 is a wireless system, the semiconductor system 200 may further include a wireless interface 240. In this case, the wireless interface 240 may be connected to the processor 220 to wirelessly exchange data with an external wireless device (not shown) via the system bus 210. For example, the processor 220 may process the data input through the wireless interface 240 and store the processed data in the semiconductor device 10 or 100, or read out the data from the semiconductor device 10 or 100 and transmit the read data to the wireless interface 240.

The wireless system may be a wireless device such as PDAs, portable computers, wireless telephones, pagers, or digital cameras, radio-frequency identification (RFID) readers, or RFID systems. Also, the wireless system may include wireless local area network (WLAN) systems or wireless personal area network (WPAN) systems. Also, the wireless system may include a cellular network.

When the semiconductor system 200 is an image pick-up device, the semiconductor system 200 may further include an image sensor 260 for converting an optical signal to an electric signal. The image sensor 260 may be an image sensor using a charge coupled device (CCD) or a complementary metal-oxide semiconductor (CMOS) image sensor manufactured using a CMOS process. In this case, the semiconductor system 200 may be a digital camera or a cellular telephone having a digital camera function. Also, the semiconductor system 200 may be an artificial satellite system to which a camera is attached.

Figure 10:
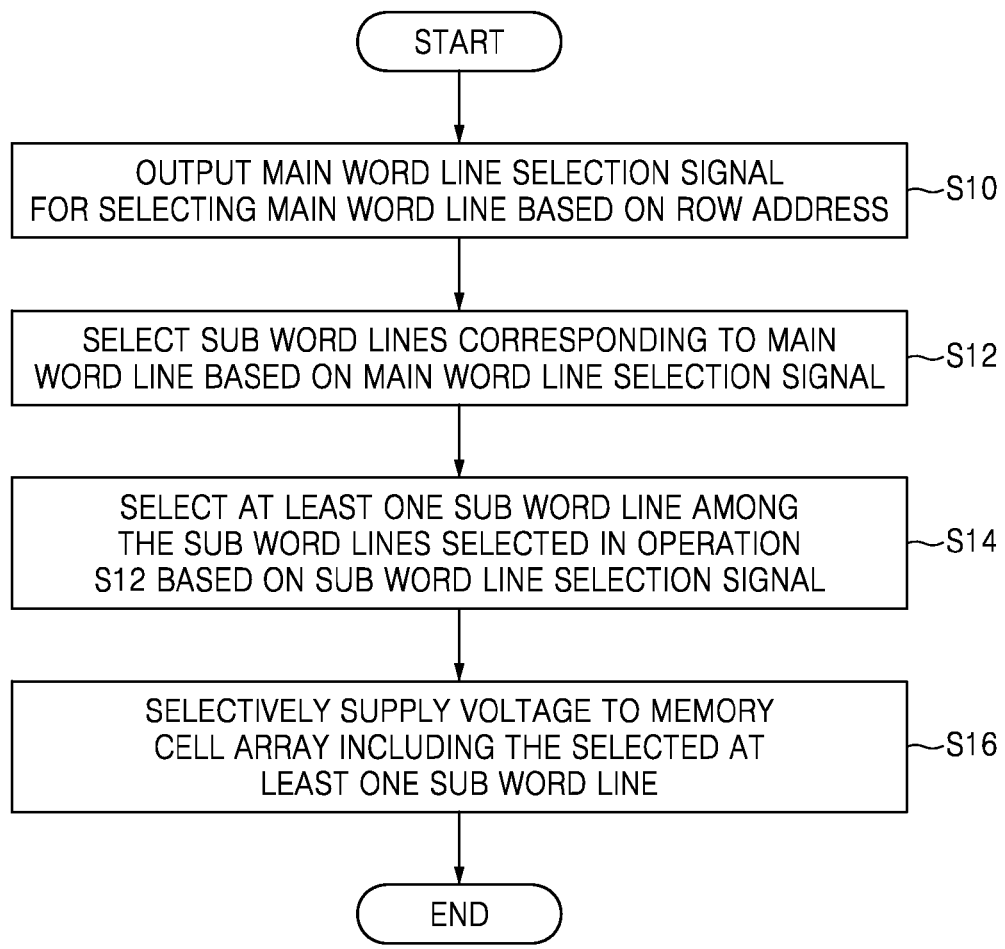
FIG. 10 is a flowchart of a method of selectively supplying power in a semiconductor device according to an exemplary embodiment.

FIG. 10 is a flowchart of a method of selectively supplying power in a semiconductor device according to an exemplary embodiment. Referring to FIGS. 5, 7, and 10, the main row decoder 120 outputs a main word line selection signals MWLi or MWLj in response to a row address transmitted from a controller (not shown) in operation S10.

The first sub word line selection block 121 included in the memory unit BLK1 selects a plurality of sub word lines WL corresponding to a main word line based on the main word line selection signal MWLi or MWLj output from the main row decoder 120 in operation S12.

The second sub word line selection block SC1 selects at least one sub word line from among the sub word lines WL selected by the first sub word line selection block 121 based on sub word line selection signals W1 through Wn in operation S14.

The voltage supply controller 161 selectively supplies the voltage VPP1 to a memory cell array that includes the at least one sub word lines selected by the second sub word line selection block SC1 in operation S16.

According to an exemplary embodiment, a voltage is selectively supplied to each layer of a semiconductor memory device in a semiconductor device, so that decoding complexity can be reduced. In addition, a voltage is selectively supplied to only a semiconductor memory device that is activated, so that leakage current that may occur in a semiconductor memory device that is not activated can be reduced.

While exemplary embodiments have been particularly shown and described, it will be understood by those of ordinary skill in the art that various changes in forms and details may be made therein without departing from the spirit and scope of the following claims.

What is claimed is:

1. A semiconductor device comprising:
   a first semiconductor memory device and a second semiconductor memory device;
   a first selection circuit configured to selectively transmit a first memory cell selection signal to the first semiconductor memory device, and a second selection circuit configured to selectively transmit a second memory cell selection signal to the second semiconductor device, and
   a voltage supply controller configured to selectively supply a voltage to the first selection circuit and the second selection circuit based on which memory cells of the first and second semiconductor memory devices are active,
   wherein the voltage supply controller supplies the voltage to the first selection circuit and does not supply the voltage to the second selection circuit in response to a memory cell of the first semiconductor memory device being activated and a memory cell of the second semiconductor memory device not being activated.

2. The semiconductor device of claim 1, further comprising a first sub-memory selection circuit configured to selectively transmit a first sub memory cell selection signal to the first selection circuits, and a second sub-memory selection circuit configured to selectively transmit a second sub memory cell selection signal to the second selection circuit.

3. The semiconductor device of claim 2, wherein the voltage supply controller is configured to selectively supply a voltage to the first sub-memory selection circuits and the second sub-memory selection circuit.

4. The semiconductor device of claim 2, wherein the voltage supply controller is implemented within only one of the first and second semiconductor memory devices.

5. The semiconductor device of claim 3,
   wherein the voltage supply controller selectively supplies the voltage to the first selection circuit and the first sub-memory selection circuit that are connected to the first semiconductor memory device and does not supply the voltage to the second selection circuit and the second sub-memory selection circuit that are connected to the second semiconductor memory device, in response to the memory cell of the first semiconductor memory device being activated and the memory cell of the second semiconductor memory device not being activated.

6. The semiconductor device of claim 5, wherein the voltage supply controller receives information about which memory cells of the first and second semiconductor memory devices are active, from a controller.

7. The semiconductor device of claim 5, wherein the first semiconductor memory device and the second semiconductor memory device are vertically disposed in the semiconductor device.

8. The semiconductor device of claim 3, wherein the first selection circuit receives a main memory cell selection signal from a main selection circuit and transmits the first memory cell selection signal to a first memory cell based on the received main memory cell selection signal.

9. The semiconductor device of claim 8,
wherein a first sub-memory selection circuit transmits a first sub memory cell selection signal only to a portion of the first selection circuit that is connected to the first memory cell.

10. The semiconductor device of claim 8, wherein the first and second semiconductor memory devices are made using a phase-change material.

11. The semiconductor device of claim 9, wherein the first and second selection circuits are decoders.

12. The semiconductor device of claim 1, wherein each of the first selection circuit and the second selection circuit is either a word line selection circuit that selects a word line or a bit line selection circuit that selects a bit line.

13. A semiconductor system comprising:
the semiconductor device of claim 1; and
a processor configured to control a program operation and a verify read operation of the semiconductor device.

14. A method of supplying a voltage in a semiconductor device, the method comprising:
selectively transmitting a first memory cell selection signal by a first selection circuit to a first semiconductor memory device and a second memory selection signal by a second selection circuit to a second semiconductor memory device; and
selectively supplying a voltage by a voltage supply controller to the first selection circuit and the second selection circuit based on which memory cells of the first and second semiconductor memory devices are active,
wherein the selectively supplying the voltage comprises supplying the voltage to the first selection circuit and not supplying the voltage to the second selection circuit in response to a memory cell of the first semiconductor memory device being activated and a memory cell of the second semiconductor memory device not being activated.

15. The method of claim 14, further comprising:
selectively transmitting a first sub-memory cell selection signal by a first sub-memory selection circuit to the first selection circuit and a second sub-memory cell selection signal by a second sub-memory selection circuit to the second selection circuit.

16. The method of claim 15, further comprising:
selectively supplying, by the voltage supply controller, a voltage to the first sub-memory selection circuit and the second sub-memory selection circuit.

17. The method of claim 16, wherein the selectively supplying the voltage to the first sub-memory selection circuit and the second sub-memory selection circuit comprises supplying the voltage to the first sub-memory selection circuit and not supplying the voltage to the second sub-memory selection circuit in response to the memory cell of the first semiconductor memory device being activated and the memory cell of the second semiconductor memory device not being activated.

18. The method of claim 16, further comprising:
receiving, by the first selection circuit, a main memory cell selection signal from a main selection circuit; and
transmitting, by the first selection circuit, the first memory cell selection signal to a first memory cell based on the received main memory cell selection signal.

19. The method of claim 18, further comprising:
transmitting, by a first sub-memory selection circuit, a first sub-memory cell selection signal only to a portion of the first selection circuit that is connected to the first memory cell.

20. The method of claim 14, wherein each of the first election circuit and the second selection circuit is either a word line selection circuit that selects a word line or a bit line selection circuit that selects a bit line.

* * * * *